United States Patent
Tustaniwskyj et al.

(10) Patent No.: US 6,179,047 B1
(45) Date of Patent: Jan. 30, 2001

(54) MECHANICAL ASSEMBLY FOR REGULATING THE TEMPERATURE OF AN ELECTRONIC DEVICE WHICH INCORPORATES AT LEAST TWO LEAF SPRINGS FOR SELF-ALIGNMENT PLUS A LOW INITIAL CONTACT FORCE AND A LOW PROFILE

(75) Inventors: Jerry Ihor Tustaniwskyj, Mission Viejo; James Wittman Babcock, Escondido, both of CA (US)

(73) Assignee: Unisys Corporation, Blue Bell, PA (US)

(*) Notice: Under 35 U.S.C. 154(b), the term of this patent shall be extended for 0 days.

(21) Appl. No.: 09/210,264

(22) Filed: Dec. 10, 1998

(51) Int. Cl.$^7$ ...................................................... F28F 7/00
(52) U.S. Cl. ..................... 165/80.4; 165/185; 361/702; 257/719; 257/718
(58) Field of Search ...................... 165/80.4, 80.3, 165/185; 361/696, 701, 702, 704; 257/714, 718, 719

(56) References Cited

U.S. PATENT DOCUMENTS

| | | | |
|---|---|---|---|
| 4,013,337 | * 3/1977 | Roger et al. | 257/718 X |
| 4,498,530 | * 2/1985 | Lipschutz | 165/185 |
| 4,908,695 | * 3/1990 | Morihara et al. | 257/719 |
| 5,001,548 | * 3/1991 | Iversen | 361/699 |
| 5,036,384 | * 7/1991 | Umezawa | 361/699 |
| 5,052,481 | * 10/1991 | Horvath et al. | 165/185 |
| 5,132,873 | * 7/1992 | Nelson et al. | 165/80.4 |
| 5,159,531 | * 10/1992 | Horvath et al. | 165/185 X |
| 5,842,512 | * 12/1998 | Guerrero | 165/185 X |
| 5,875,096 | * 2/1999 | Gates | 257/718 |

OTHER PUBLICATIONS

Beaulieu, Modular Thermal Clip IBM, pp. 4851–4852, Apr. 1981.*
Self–Loaded Plates for Chip Cooling, IBM, p. 151, Jun. 1989.*
Ostergren, Chip–Cooling Structure, IBM pp. 313–314, Jun. 1982.*

* cited by examiner

*Primary Examiner*—Christopher Atkinson
(74) *Attorney, Agent, or Firm*—Charles J. Fassbender; Mark T. Starr; Rocco L. Adornato

(57) ABSTRACT

A mechanical assembly for regulating the temperature of an integrated circuit chip is comprised of a frame which has at least two spaced-apart spring supports. Respective leaf springs extend from each of the spring supports towards each other. And, a heat exchanger lies in the space between the spring supports, attaches to all of the leaf springs, and has a face for mating with the chip. With this assembly, the heat exchanger exerts a very small force at its initial point of contact on the chip; the length of the leaf springs do not add to the profile of the assembly; no slippage occurs between the heat exchanger and the chip; and, the leaf springs prevent the heat exchanger from twisting and becoming offset relative to the chip.

14 Claims, 14 Drawing Sheets

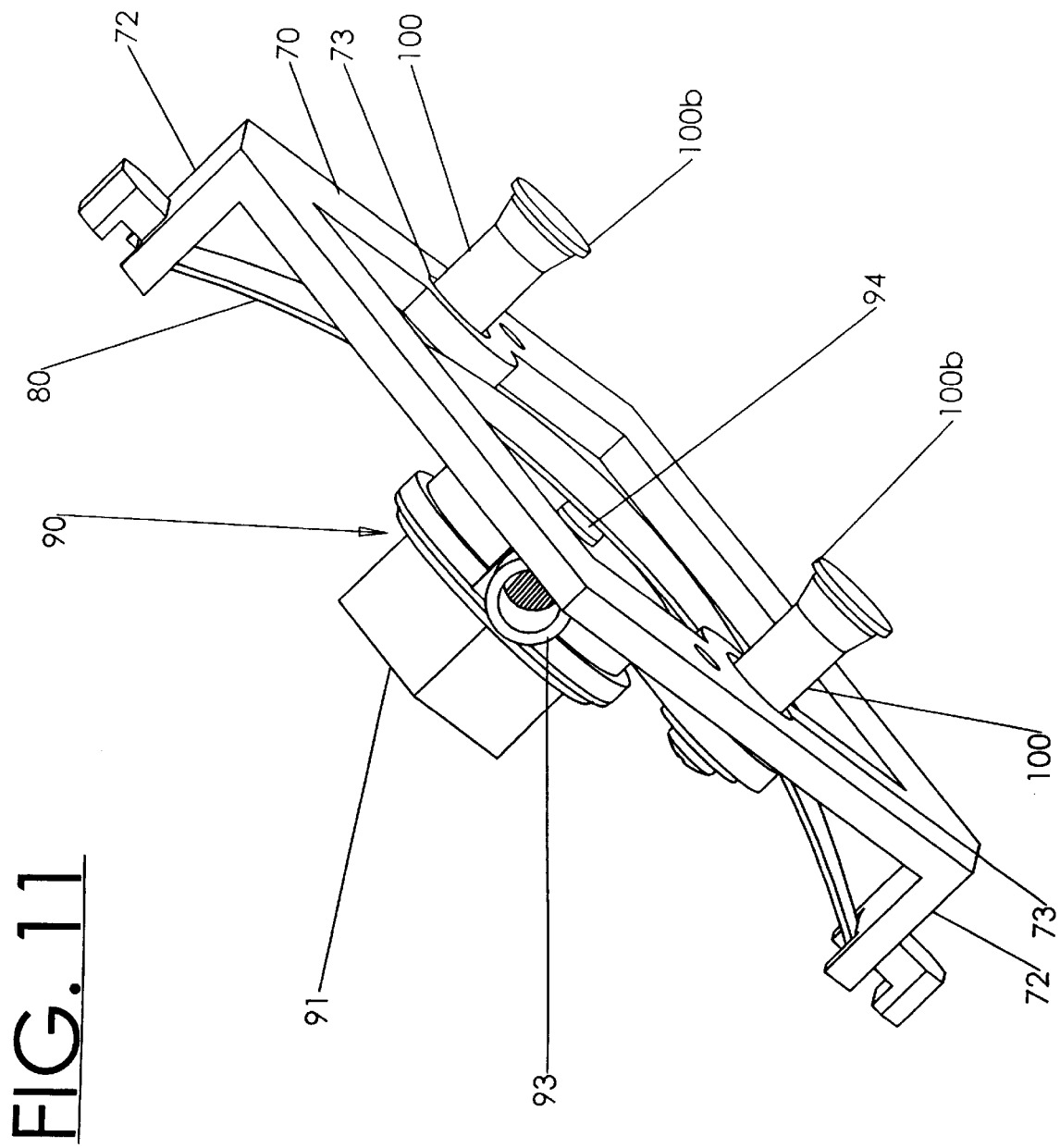

MECHANICAL ASSEMBLY FOR REGULATING THE TEMPERATURE OF AN ELECTRONIC DEVICE WHICH INCORPORATES AT LEAST TWO LEAF SPRINGS FOR SELF-ALIGNMENT PLUS A LOW INITIAL CONTACT FORCE AND A LOW PROFILE

RELATED CASES

The above-identified invention is related to two other inventions which are described herein with one common Detailed Description. These two other related inventions are:

"MECHANICAL ASSEMBLY FOR REGULATING THE TEMPERATURE OF AN ELECTRONIC DEVICE WHICH INCORPORATES A HEAT EXCHANGER THAT CONTACTS AN ENTIRE PLANAR FACE ON THE DEVICE EXCEPT FOR ITS CORNERS," filed Dec. 10, 1998 having U.S. Ser. No. 09/210,259; and, "MECHNICAL ASSEMBLY FOR REGULATING THE TEMPERATURE OF AN ELECTRONIC DEVICE WHICH INCORPORATES A SINGLE LEAF SPRING FOR SELF-ALIGNMENT PLUS A LOW INITIAL CONTACT FORCE AND A LOW PROFILE", filed Dec. 10, 1998 having U.S. Ser. No. 09/210,266.

BACKGROUND OF THE INVENTION

This invention relates to mechanical assemblies that regulate the temperature of an electronic device, such as an integrated circuit chip, by pressing a temperature controlled heat exchanger against the chip.

In the prior art, one assembly of the above type is described in U.S. Pat. No. 4,791,983 which is assigned to the assignee of the present invention. The assembly in patent '983 uses a coil spring 20 to press a planar surface of a liquid cooling jacket against a planar surface of an integrated circuit chip. More specifically, the coil spring 20 is compressed in a direction perpendicular to the planar surfaces of the liquid cooling jacket and the integrated circuit chip to squeeze those surfaces together and thereby lower the thermal resistance between them.

Due to various manufacturing tolerances, the planar surface of the integrated circuit chip (to which the cooling jacket mates) can be oriented at different angles and different heights relative to a nominal position. To accommodate these variances, the assembly in patent '983 includes a guidepost 18 which is attached to the cooling jacket, extends perpendicular to the mating faces of the cooling jacket and the integrated circuit chip, and is loosely held by a beam 14. This guidepost, together with the coil spring and the cooling jacket, can tilt at different angles and move to different heights to thereby accommodate the variations in the orientation of the integrated circuit chip.

With the assembly of patent '983, it is desirable for the coil spring to have a small spring constant. That is because when the planar surface on the cooling jacket initially contacts the planar surface on the integrated circuit chip, those two surfaces will be at different angles, so contact will initially occur at a single point on the corner of the chip. If the coil spring has a small spring constant, then the force that is exerted at the initial point of contact will be small and the chances of cracking the corner of the chip will be reduced.

On the other hand, to insure that the thermal resistance between the mating surfaces of the cooling jacket and the chip is sufficiently small, the final force with which those two surfaces are pressed together must be large. Thus to achieve this large final force with a small spring constant, the coil spring 20 must have a long length. However, increasing the length of the spring 20 inherently increases the minimal distance with which several of the assemblies can be placed side-by-side in a rack within an end-product.

Also, after initial contact occurs between the planar surface of the cooling jacket in patent '983 and one corner of the chip, the cooling jacket must pivot on the guidepost to make the cooling jacket lie flat against the chip. However, in order for the cooling jacket to pivot on the guidepost, its planar surface must slip on the chip at the initial point of contact. And, such slippage between the cooling jacket and the chip can damage the chip.

Further with the assembly of patent '983, the planar surface of the cooling jacket can become twisted and/or offset relative to the planar surface of the chip. To accommodate the above problem, the planar surface of the cooling jacket can be made substantially larger than the planar surface of the integrated circuit chip. But, such an increase in the size of the cooling jacket will be prohibited if the chip is held by a socket which the enlarged cooling jacket can hit, or another component lies next to the chip which the enlarged cooling jacket can hit.

Accordingly, a primary object of the present invention is to provide an improved mechanical assembly for regulating the temperature of an integrated circuit chip in which all of the above drawbacks with the prior art are overcome.

BRIEF SUMMARY OF THE INVENTION

In accordance with the present invention, a mechanical assembly for regulating the temperature of an integrated circuit chip is comprised of a frame which has at least two spaced-apart spring supports. Respective leaf springs extend from each of the spring supports towards each other. And, a heat exchanger lies in the space between the spring supports, attaches to all of the leaf springs, and has a face for mating with the chip.

With this assembly, the leaf springs deflect while the frame is moved such that the face of the heat exchanger presses against the chip. When the face of the heat exchanger initially contacts the chip, the leaf springs have a minimal deflection. Thus, the heat exchanger exerts a very small force at its initial point of contact with the chip.

Subsequently, when the face of the heat exchanger is pressed with a large final force against the chip, the leaf springs have a maximum deflection. But only the length of that deflection, and not the length of the leaf springs, adds to the profile of the assembly. Consequently, the minimal distance with which several of the assemblies can be placed side-by-side is small.

As the face of the heat exchanger moves from its initial point of contact with the chip to its final position where the large force is exerted on the chip, the leaf springs slip on the spring supports or the heat exchanger. No slippage occurs between the face of the heat exchanger and the chip.

Also, the leaf springs only deflect in one direction. Thus, the leaf springs prevent the face of the heat exchanger from twisting relative to the mating surface of the chip; and, the leaf springs also prevent the face of the heat exchanger from becoming offset relative to the mating surface of the chip.

BRIEF DESCRIPTION OF THE DRAWINGS

FIG. 11 shows an underside view of the second embodiment of FIG. 10.

DETAILED DESCRIPTION

Figure 1:
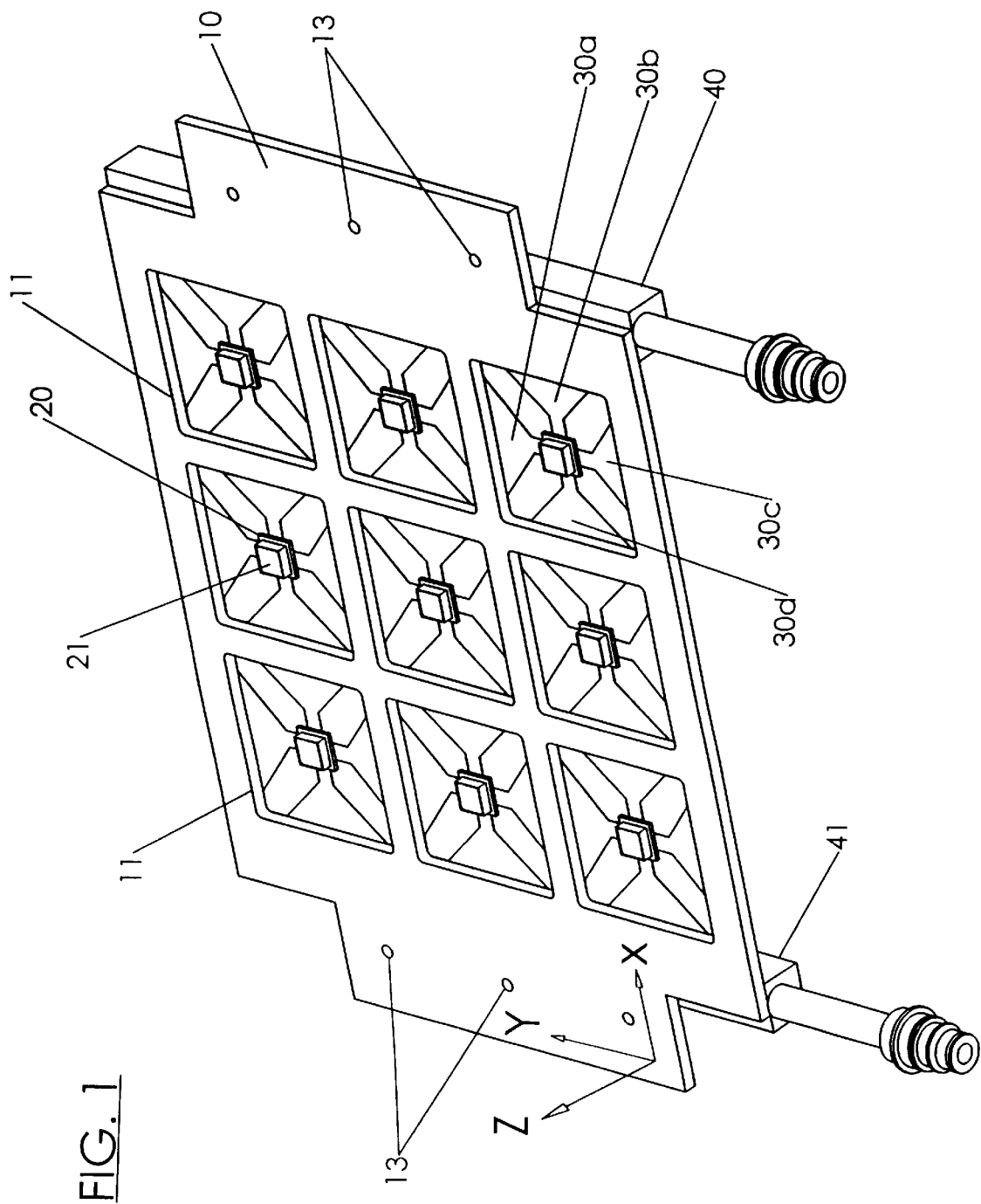
FIG. 1 shows a mechanical assembly, for regulating the temperature of an electronic device, which constitutes one preferred embodiment of the present invention.

With reference now to FIG. 1, the details of a preferred embodiment of the present invention will be described. This FIG. 1 embodiment includes a flat, rigid, frame 10 which lies in a single X-Y plane, and which has nine openings that are indicated by reference numeral 11. Within each of the openings 11 is a heat exchanger 20 that has a face 21 for mating with an electronic device (not shown) whose temperature is to be regulated. Each heat exchanger 20 is held spaced-apart from the frame 10 by a respective set of four leaf springs 30a–30d which extend from the frame 10 to the heat exchanger.

Also attached to the frame 10, in the FIG. 1 embodiment, is an input manifold 40 and an output manifold 41 for a liquid coolant. This liquid passes from the input manifold 40 through each of the heat exchangers 20 and then to the output manifold 41. Flexible tubes, which lie on the back of the frame 10, carry the liquid between the heat exchangers 20 and the manifolds 40 and 41; and those tubes are hidden from view in FIG. 1.

Figure 2:
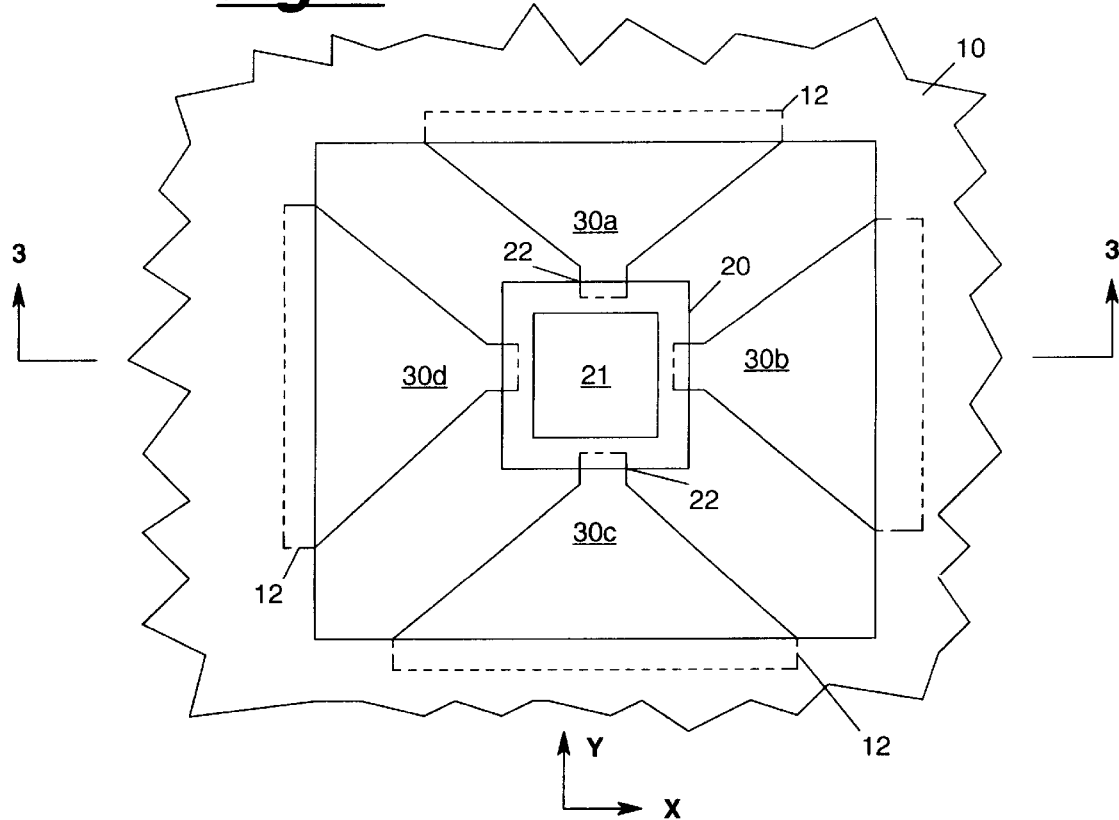
FIG. 2 shows an enlarged top view of a heat exchanger which is held to a frame by four leaf springs in the FIG. 1 embodiment.
Figure 3:
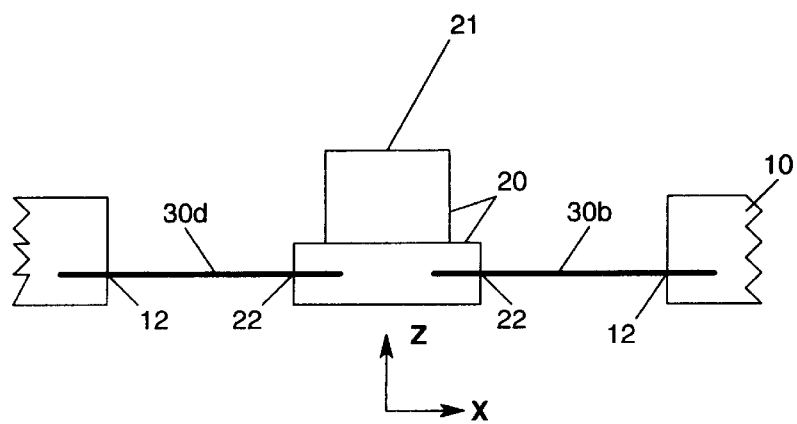
FIG. 3 shows a sectional view taken along lines 3—3 in FIG. 2.

An enlarged top view of one of the heat exchangers 20 with its four leaf springs 30a–30d is shown in FIG. 2; and a corresponding cross-section taken through that heat exchanger is shown in FIG. 3. These FIGS. 2 and 3 illustrate that one end of each leaf spring 30a–30d is held in a slot 12 in the frame 10, while the opposite end of each leaf spring is held in a slot 22 in the heat exchanger 20. Leaf springs 30a and 30c are able to slide in the Y direction in their slots, while leaf springs 30b and 30d are able to slide in the X direction in their slots.

With the above embodiment, the leaf springs 30a–30d hold face 21 of the heat exchanger 20 at an initial position in the X-Y plane; and the leaf springs 30a–30d prevent face 21 of the heat exchanger 20 from twisting from that initial position in the X-Y plane. These features are desirable because they ensure that face 21 will not be offset in the X or Y direction with the corresponding face on the electronic device to which the face 21 mates.

Also with the above embodiment, face 21 on the heat exchanger 20 is free to move in the Z direction, which is perpendicular to the X-Y plane. In addition, face 21 on the heat exchanger 20 is free to tip with respect to the X-Y plane. These features are desirable because they enable the heat exchanger 20 to accommodate misalignments between the X-Y plane and the face on the electronic device (not shown) to which the face 21 mates.

Figure 4:
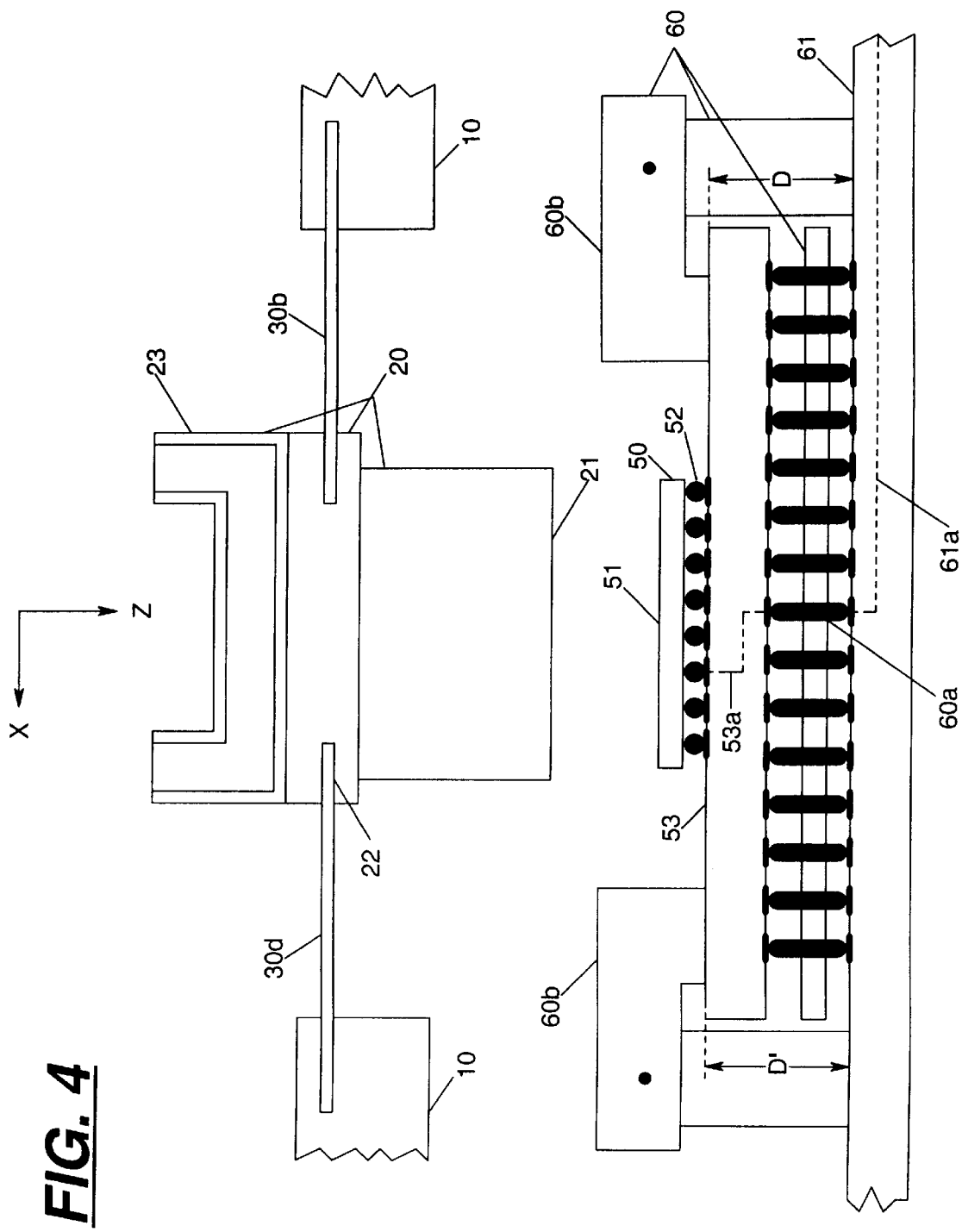
FIG. 4 shows an example of how the FIG. 1 embodiment is used to regulate the temperature of an electronic device.

Turning now to FIG. 4, it shows an example of how the embodiment of FIGS. 1, 2 and 3 is used to regulate the temperature of an electronic device 50. In FIG. 4, the electronic device 50 is an integrated circuit chip, and it has a face 51 that is to mate with face 21 of the heat exchanger 20. In FIG. 4, the electronic device 50 has input/output terminals 52 which are soldered to a substrate 53; and the substrate 53 is held in a socket 60 which is mounted on a printed circuit board 61.

Integrated into the substrate 53 and the printed circuit board 61 are hundreds of microscopic electrical conductors which carry power and signals between the electronic device 50 and the printed circuit board. One conductor in the substrate 53 is indicated by reference numeral 53a; a corresponding conductor in the printed circuit board 61 is indicated by reference numeral 61a; and they are interconnected by a fuzz-button 60a in the socket 60. As the signals on those conductors change from one state to another, the amount of power which is dissipated within the electronic device 50 changes; and that in turn causes the temperature of the electronic device 50 to change.

To regulate the temperature of the electronic device 50, face 21 of the heat exchanger 20 is placed flush against face 51 of the electronic device while a constant temperature liquid is passed through a conduit 23 on the back of the heat exchanger. Contact is made between face 51 of the electronic device 50 and face 21 of the heat exchanger 20 by moving the frame 10 in the Z direction via any suitable positioning mechanism. Such a mechanism is attached to the frame 10 by several bolts that pass through the holes 13 that are shown in the frame 10 in FIG. 1.

Due to various manufacturing tolerances, face 51 of the electronic device 50 in FIG. 4 will always be tilted with respect to the X-Y plane. These manufacturing tolerances include, for example, variations in the respective distances D and D' at which two moveable arms 60b in the socket 60 hold the substrate 53 from the printed circuit board 61, and variations in the distance by which the solder connections 52 hold the electronic device 50 above the substrate 53. However, the tilting of face 51 with respect to the X-Y plane is accommodated by the operation of the four leaf springs 30a–30d; and this operation is illustrated in FIGS. 5A–5D.

Figure 5A:
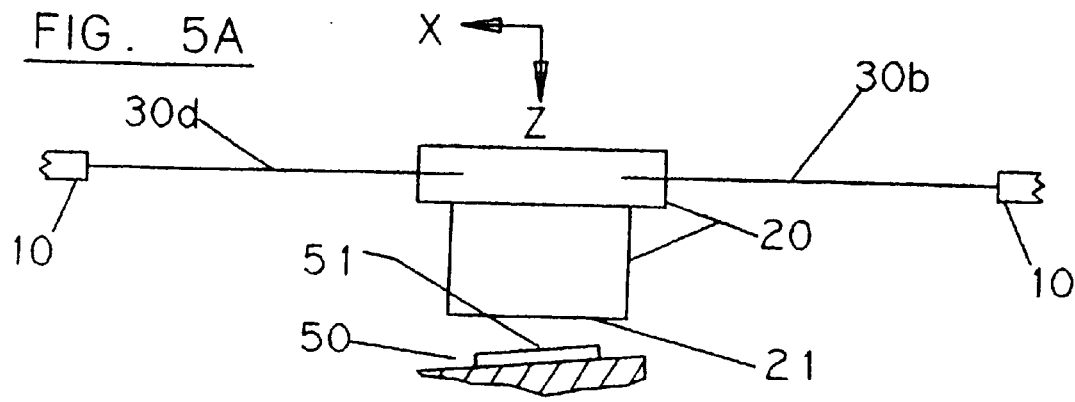
FIGS. 5A–5D show a sequence of steps during which the leaf springs in the FIG. 1 embodiment deflect and thereby accommodate misalignments between the heat exchanger and the electronic device.

In FIG. 5A, face 21 of the heat exchanger 20 lies parallel to the X-Y plane; whereas face 51 of the electronic device 50 is tilted at an angle of about five degrees with respect to the X-Y plane. Consequently, when the frame 10 is moved in the Z direction, face 21 of the heat exchanger 20 will initially touch face 51 of the electronic device 50 at only one point 51a. When that occurs, the point on face 51 which is spaced furthest from face 21 is indicated by reference numeral 51b, and its spacing is indicated as distance D1.

Then, after the frame 10 is moved in the Z direction by the distance D1/2, the entire face 51 on the electronic device 50 will be in contact with face 21 on the heat exchanger 20. This is shown in FIG. 5C. During the transition from FIG. 5B to FIG. 5C, the leaf springs 30a–30d deflect, and that enables face 21 on the heat exchanger to become aligned with face 51 on the electronic device 50.

Figure 5B:
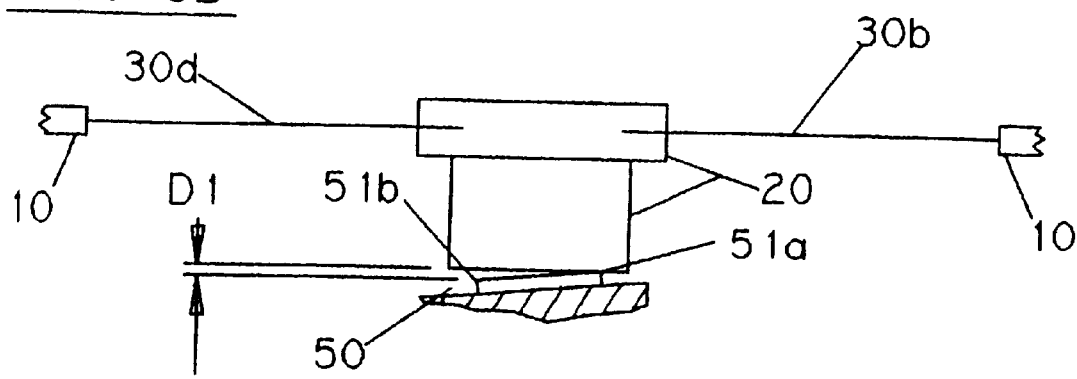
Figure 5C:
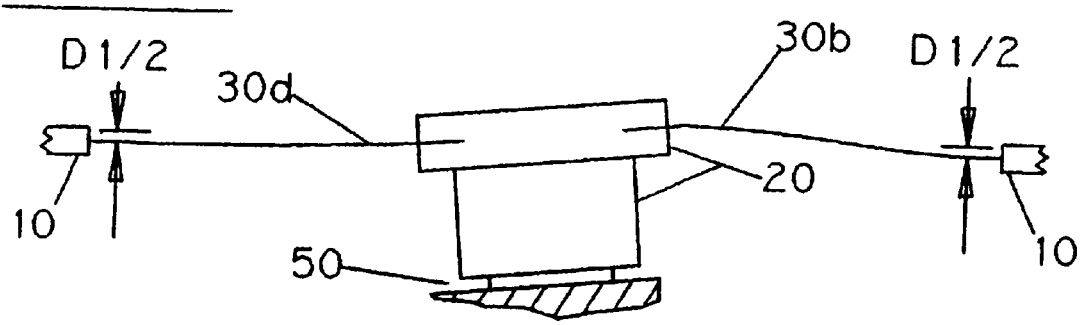
Figure 5D:
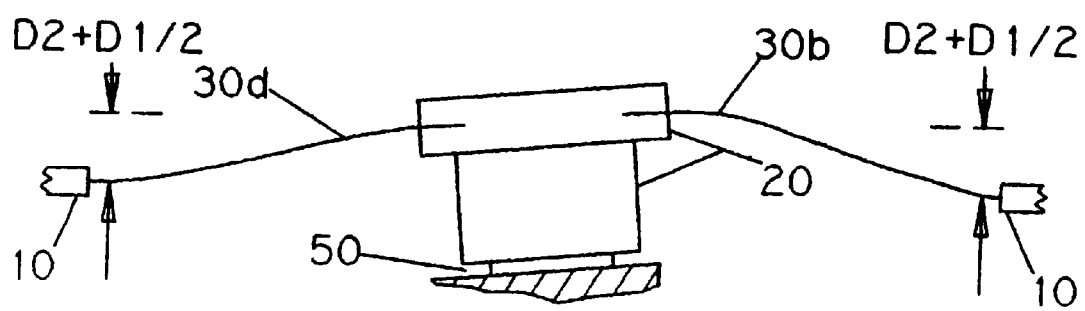

Thereafter, the frame 10 is moved an additional distance D2 in the Z direction as shown in FIG. 5D. During the transition from FIG. 5C to FIG. 5D, each of the leaf springs 30a–30d slip in their respective slots 12 and 22 while the amount of deflection in each of the leaf springs increases. This increases the force with which the two mating faces 21 and 51 are pressed together; and consequently, the thermal resistance between those mating faces decreases.

While the heat exchanger 20 is pressed against the electronic device 50 as shown in FIG. 5D, the electronic device 50 can be operated and/or tested by passing electrical signals between it and the printed circuit board 61. During that exercise, the temperature of the electronic device 50 is regulated by the heat exchanger 20. Subsequently, when the operating/testing of the electronic device 50 is completed, the heat exchanger 20 is separated from the electronic device 50 by moving the frame 10 from its position in FIG. 5D to its position in FIGS. 5C, 5B and 5A. Then, the electronic device 50 is removed from the socket 60 and replaced with another electronic device which is to be operated/tested.

One feature of the above-described embodiment is that during the transition from FIG. 5B to FIG. 5C, the maximum force which is exerted by the leaf springs 30a–30d on face 51 of the electronic device 50 is very small. That force is proportional to the distance D1/2 times the effective spring constant for the four leaf springs 30a–30d. But, D1/2 is very small; and the effective spring constant is also made small simply by decreasing the thickness of the leaf springs 30a–30d and/or increasing the distance which the leaf springs traverse between the heat exchanger 20 and the frame 10. Having the leaf springs exert a small force during the transition from FIG. 5B to FIG. 5C is important because exerting a large force at the single point 51a on the electronic device can crack or otherwise damage the electronic device.

Another feature of the above-described embodiment is that it has an overall height, in the Z direction, to which all of the leaf springs 30a–30d contribute insignificantly. This height in the Z direction is seen, for example, in FIG. 1 where the only contribution which is made by the leaf springs 30a–30d is their thickness. Having a small height in the Z direction is important because it enables the FIG. 1 embodiment to be incorporated into a larger high-density structure where several of the frames 10 are stacked in parallel X-Y planes that are separated in the Z direction by a minimal distance.

Figure 6:
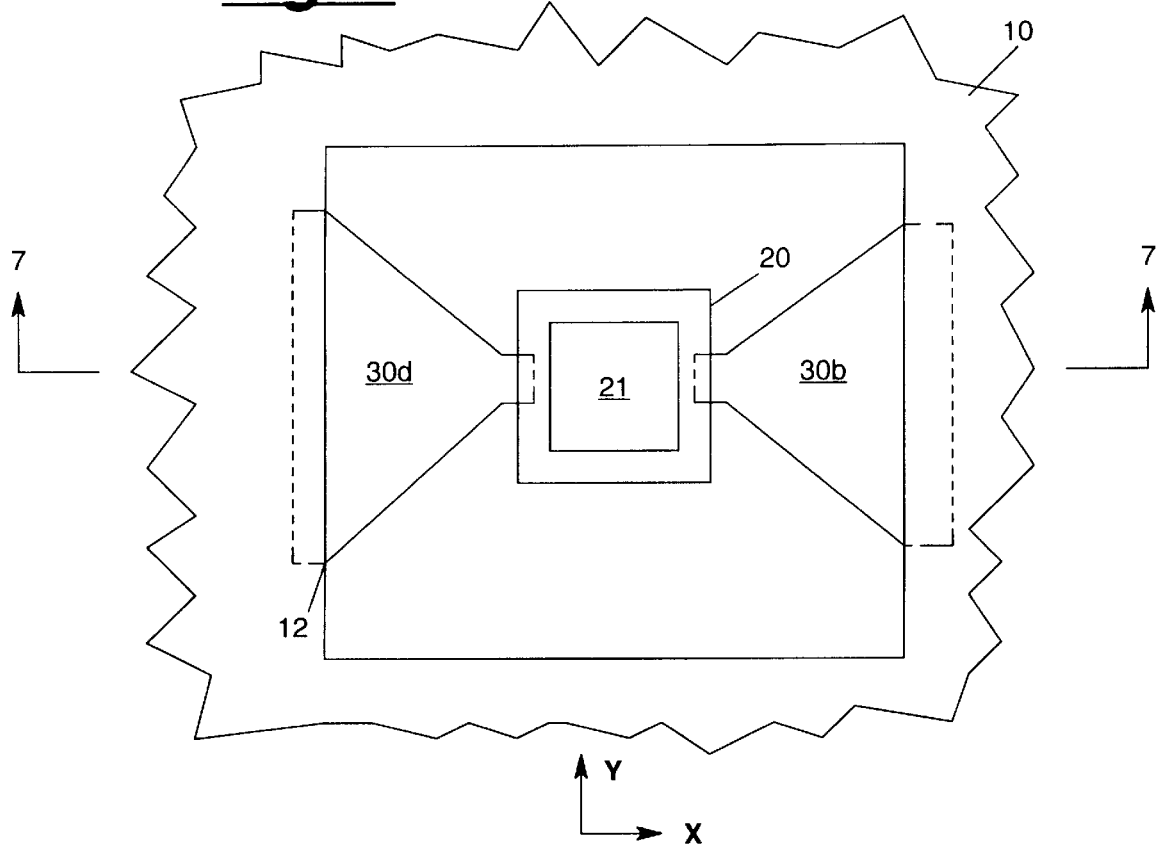
FIG. 6 shows a modification to the FIG. 1 embodiment.

A preferred embodiment of the present invention has now been described in detail. However, as one modification to the above-described embodiment, the leaf springs 30a–30d can be increased or decreased in number. Preferably, the total number of leaf springs which interconnect each heat exchanger 20 to the frame 10 is between two and ten. Such a modification is shown in FIG. 6 wherein only two leaf springs 30b and 30d couple the heat exchanger 20 to the frame 10.

Figure 7:
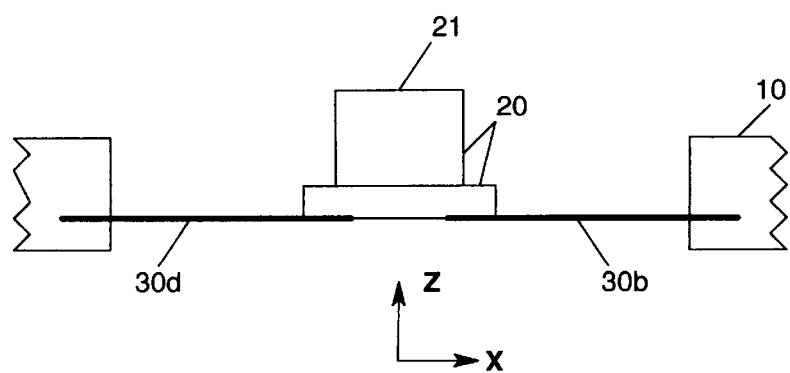
FIG. 7 shows another modification to the FIG. 1 embodiment.

As another modification, the slots 12 and 22 which support the leaf springs 30a–30d can be changed to a different type of support. For example, each of the leaf springs 30a–30d can be tightly connected to the frame 10 and can slip only in the slots 22 in the heat exchanger 20. Conversely, each of the leaf springs 30a–30d can be tightly connected to the heat exchanger 20 and can slip only in the slots 12 in the frame 10. Such a modification is shown in FIG. 7 wherein the leaf springs 30b and 30d are braised to the heat exchanger 20.

Figure 8:
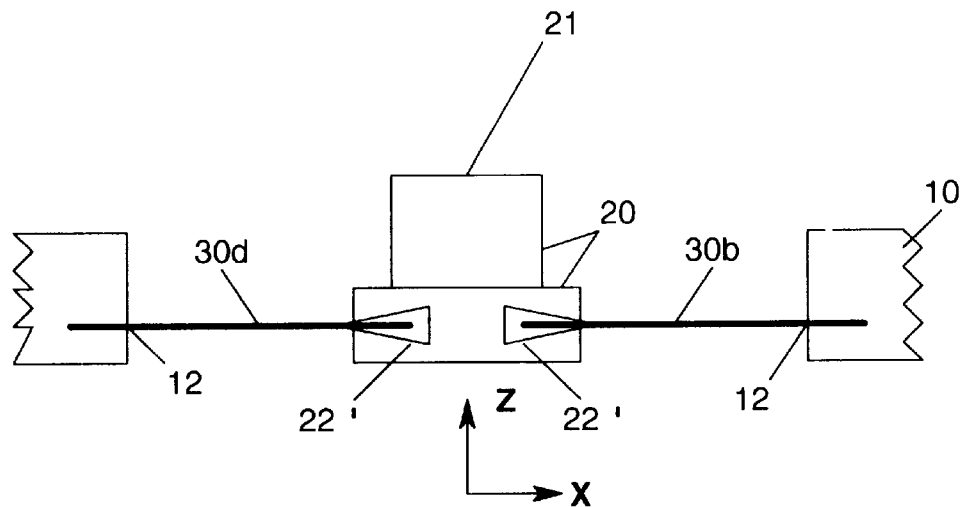
FIG. 8 shows still another modification to the FIG. 1 embodiment.

As still another modification, each of the leaf springs 30a–30d can be connected to the heat exchanger 20 such that they pivot, rather than bend, at their connection with the heat exchanger. An example of this modification is shown in FIG. 8. There, the heat exchanger 20 is provided with triangular-shaped slots 22' which pinch the leaf springs 30a–30d as they enter the slots. With this modification, each leaf spring will pivot at its pinched connection without bending because the end of the leaf spring is free to move inside the triangular slot. Consequently, no bending moment occurs in the leaf springs at their connection with the heat exchanger.

With the modification of FIG. 8, the bending moment in each leaf spring 30a–30d increases linearly as the distance along the leaf spring from the pivot point increases. Thus, to achieve a nearly constant bending stress in the leaf springs, they each have a tapered width which increases in proportion to bending moment. This taper is shown in FIG. 2; and it makes bending stress constant because bending stress is proportional to the bending moment divided by the width of the leaf spring.

Having a nearly constant bending stress in each leaf spring 30a–30d enables the thickness of each leaf spring to be reduced without overstressing the leaf spring at any one point; and, having a thin leaf spring enables the slots 12 in the frame 10 to be moved closer together without making the leaf spring too stiff. Consequently, the density with which the heat exchangers 20 can be arranged in FIG. 1 is increased.

Figure 9:
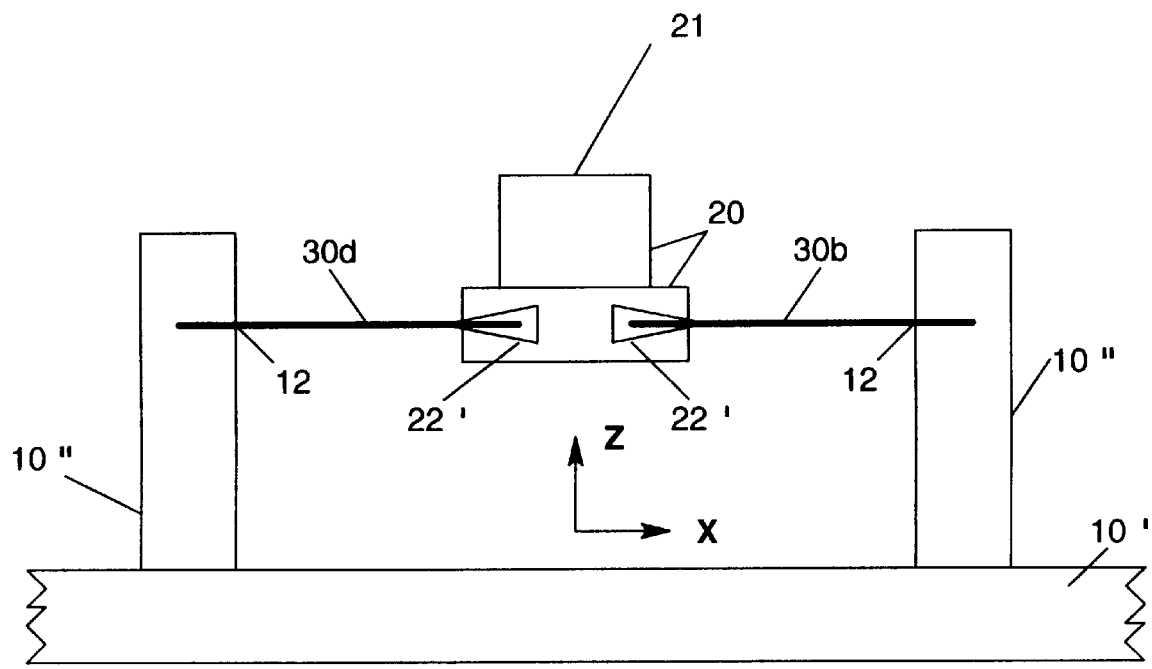
FIG. 9 shows yet another modification to the FIG. 1 embodiment.

As yet another modification, the frame 10 of FIG. 1 can be increased or decreased in size in the X-Y plane to thereby hold any number of the heat exchangers. Also, as another modification, all of the openings 11 in the FIG. 1 frame 10 can be eliminated, and the leaf springs 30a–30d can be attached to spring supports which extend from a base plate. This modification is shown in FIG. 9 wherein the base plate with none of the openings 11 is indicated by reference number 10', and two spring supports which extend from the base plate and hold the leaf springs is indicated by reference number 10".

Figure 10:
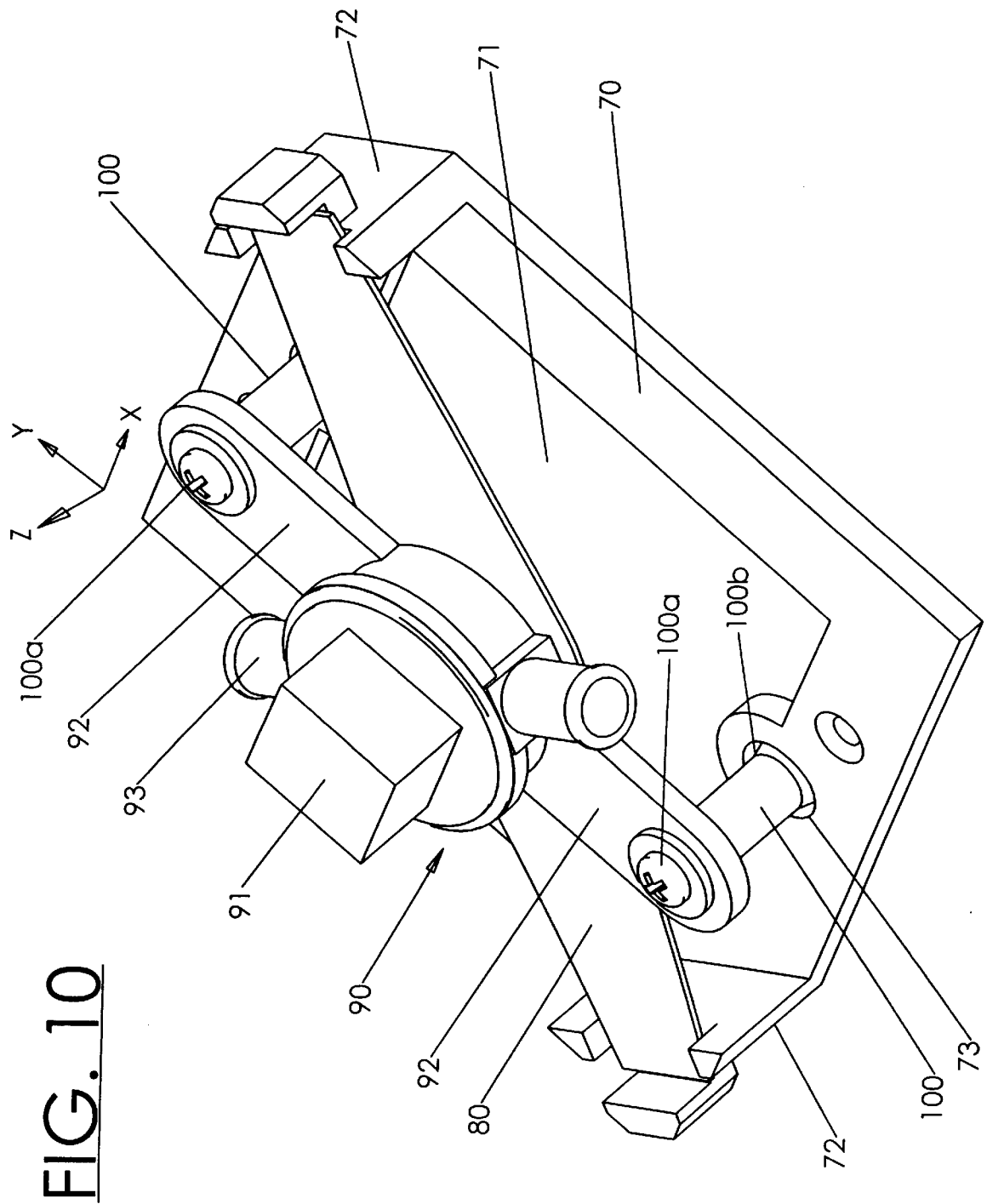
FIG. 10 shows a mechanical assembly, for regulating the temperature of an electronic device, which constitutes a second preferred embodiment of the present invention.

Referring now to FIG. 10, the details of a second preferred embodiment of the present invention will be described. This FIG. 10 embodiment includes a frame 70 which has a central opening 71, and it includes a pair of spring supports 72 that are spaced-apart by the opening 71. Extending from one spring support to the other is a single leaf spring 80, and a heat exchanger 90 contacts the leaf spring 80 at its center.

This heat exchanger 90 has a face 91 for mating with an electronic device, such as the previously described electronic device 50 in FIG. 4. Also, the heat exchanger 90 pushes the leaf spring 80 against the spring supports 72, and it pivots on the center of the leaf spring 80.

To ensure that all of the components 70, 80, and 90 stay held together, the FIG. 10 embodiment also includes a pair of stops 100. Each stop has one end that is connected by a screw 100*a* to a respective arm 92 on the heat exchanger, and it has another end 100*b* which passes through a hole 73 in the frame 70. End 100*b* tapers outward, and it has a flange which engages the frame 70 whenever the deflection of the center of the leaf spring 80 is at a predetermined minimum distance.

With the FIG. 10 embodiment, the temperature of an electronic device is regulated by pressing face 91 of the heat exchanger 90 against a corresponding face of the electronic device while a constant temperature liquid passes through a conduit 93 in the heat exchanger. This is achieved by moving the FIG. 10 embodiment in the Z direction in a manner similar to that which was described previously in conjunction with FIGS. 5A–5D.

Initially, before the heat exchanger 90 contacts the electronic device, face 91 of the heat exchanger is aligned in the X-Y plane. This alignment occurs automatically due to the operation of the stops 100. In particular, the flange on end 100*b* of each stop 100 engages the frame 70 to thereby hold face 91 of the heat exchanger in the X-Y plane; and the taper on end 100*b* moves face 91 sideways and rotationally in the X-Y plane to a particular position in that plane.

Thereafter, the frame 70 is moved in the Z direction until face 91 of the heat exchanger contacts the electronic device at a single point, such as point 51a in FIG. 5B. Then, as the frame 70 is moved an additional distance D1/2 in the Z direction, face 91 of the heat exchanger 90 will tilt out of the X-Y plane and lie flush against the corresponding face 51 of the electronic device. Lastly, the frame 70 is moved an additional distance D2 in the Z direction to increase the force with which the two mating faces 91 and 51 are pressed together; and that decreases the thermal resistance between those mating faces.

An underside view of the FIG. 10 embodiment is shown in FIG. 11. There, the spring 80 is shown in a deflected position which occurs after the frame 70 has been moved in the Z direction by the distances D1/2 and D2. FIG. 11 also shows two structural details which enable face 91 of the heat exchanger 90 to align itself with the corresponding face of the electronic device. One of those details is that the bottom of the heat exchanger 90 includes a dimple 94 which contacts the center of the leaf spring 80; and the other detail is that the stops 100 have shafts which fit loosely in the frame holes 73. Due to that loose fit, face 91 of the heat exchanger 90 is free to pivot and slide on the dimple 94 as soon as a flanged end 100*b* of a stop 100 disengages the frame 70.

One additional feature of the embodiment in FIGS. 10 and 11 is that the ends of the leaf spring 80 are free to pivot, without bending, on the spring supports 72. Consequently, no bending moment occurs in the ends of the leaf spring 80.

In the leaf spring 80, the bending moment is the largest at the center of the leaf spring, and it decreases linearly with distance from the center of the leaf spring. To achieve a nearly constant bending stress throughout the leaf spring 80, the leaf spring has a tapered width which is proportional to the bending moment. This taper is shown in FIG. 10, and it causes bending stress to be nearly constant because bending stress is proportional to the bending moment divided by the spring width.

Having a nearly constant bending stress in the leaf spring 80 allows the thickness of the leaf spring to be reduced without overstressing the leaf spring at any one point; and, having a thin leaf spring enables the spring supports 72 to be moved close together without making the leaf spring too stiff. Consequently, several of the assemblies in FIGS. 10–11 can be packaged in an array (such as the array of FIG. 1), with a high density.

Still another feature of the embodiment in FIGS. 10 and 11 is that the length of each stop 100 can be selected such that the flange on end 100*a* engages the frame 70 when the leaf spring 80 exerts a force on the heat exchanger 90 which only slightly exceeds the weight of the heat exchanger. In that case, the weight of the heat exchanger 90 in the Z direction will be cancelled out by the force which the leaf spring 80 exerts in the −Z direction. Consequently, face 91 of heat exchanger will exert essentially no force on the corresponding face of the electronic device when initial contact with that device is made; and thus, the risk of cracking the electronic device is minimal.

A second preferred embodiment of the present invention has now been described in detail in conjunction with FIGS. 10 and 11. However, as one modification to that second embodiment, the dimple 94 on the bottom of the heat exchanger 90 can be replaced with an alternative structure which allows the heat exchanger to pivot on the center of the leaf spring 80. For example, the entire bottom surface of the heat exchanger 90 can have a convex shape. Alternatively, the bottom surface of the heat exchanger 90 can be flat; and a dimple, such as the dimple 94, can be incorporated into the leaf spring 80.

Figure 12C:
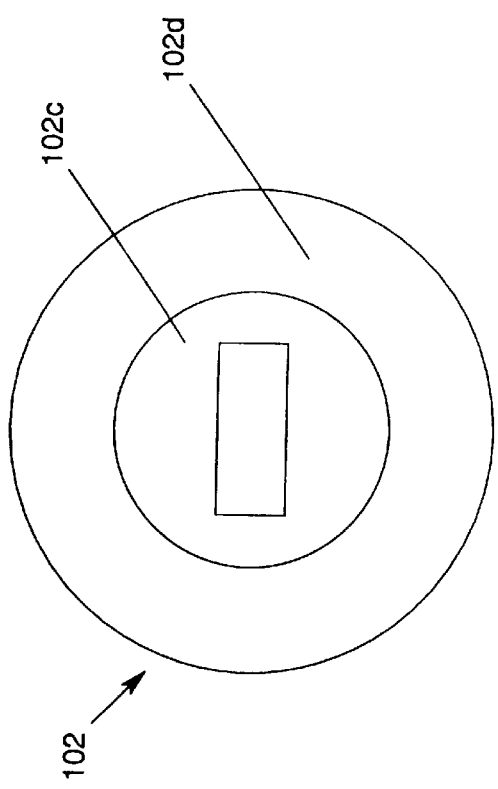
FIG. 12C shows the top view of a bushing that holds the bearing of FIG. 12A.
Figure 12D:
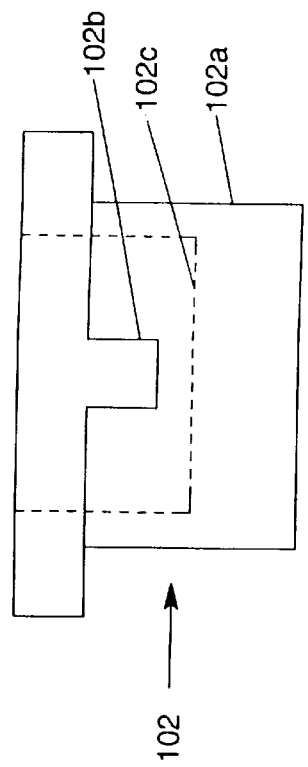
FIG. 12D shows the side view of the bushing in FIG. 12C.
Figure 12A:
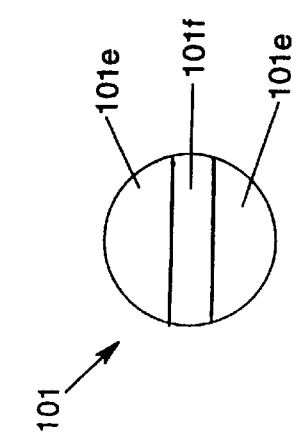
FIG. 12A shows the top view of a bearing that is used in a modification to the second embodiment of FIG. 10.
Figure 12B:
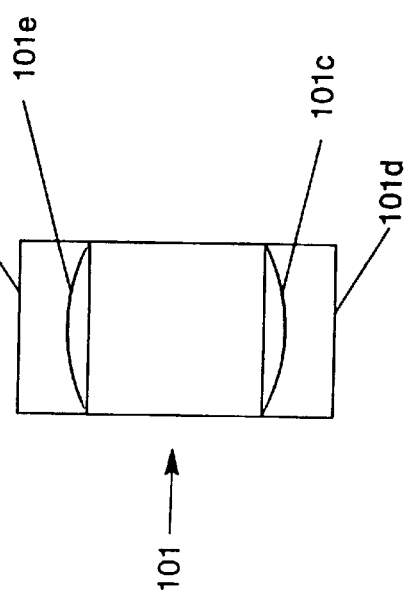
FIG. 12B shows the side view of the bearing in FIG. 12A.

Also, a gimbal can be incorporated into the leaf spring 80 which allows face 91 of the heat exchanger to pivot out of the X-Y plane, but limits twisting in the X-Y plane. An example of such a gimbal is shown in FIGS. 12A–12B; and it consists of a bearing 101 and a bushing 102. The bushing 102 has a bottom portion 102*a* which is press-fit into a hole (not shown) in the center of the leaf spring. Also, the bushing 102 has a key 102*b* which prevents the bushing from turning in the hole in the leaf spring.

The bearing 101 has a spherical-shaped bottom surface 101*c* with a fin 101*d*. Surface 101*c* of the bearing rests on a flat surface 102*c* in the bushing; and the fin 101*d* of the bearing fits loosely in a slot 102*d* in the bushing. Thus, surface 101*c* is free to pivot on surface 102*c*, but the fin 101*d* in slot 102*d* limits the twisting of surface 101*c* about the Z axis.

Similarly, the bearing 101 has a spherical-shaped tope surface 101*e* with a fin 101*f*. Surface 101*e* of the bearing rests on a flat surface on the bottom of the heat exchanger; and the fin 101*f* of the bearing fits loosely in a slot (not shown) in that heat exchanger. Thus, the heat exchanger is free to pivot on surface 101*e*, but the fin 101*f* limits the twisting of the heat exchanger about the Z axis.

Figure 13:
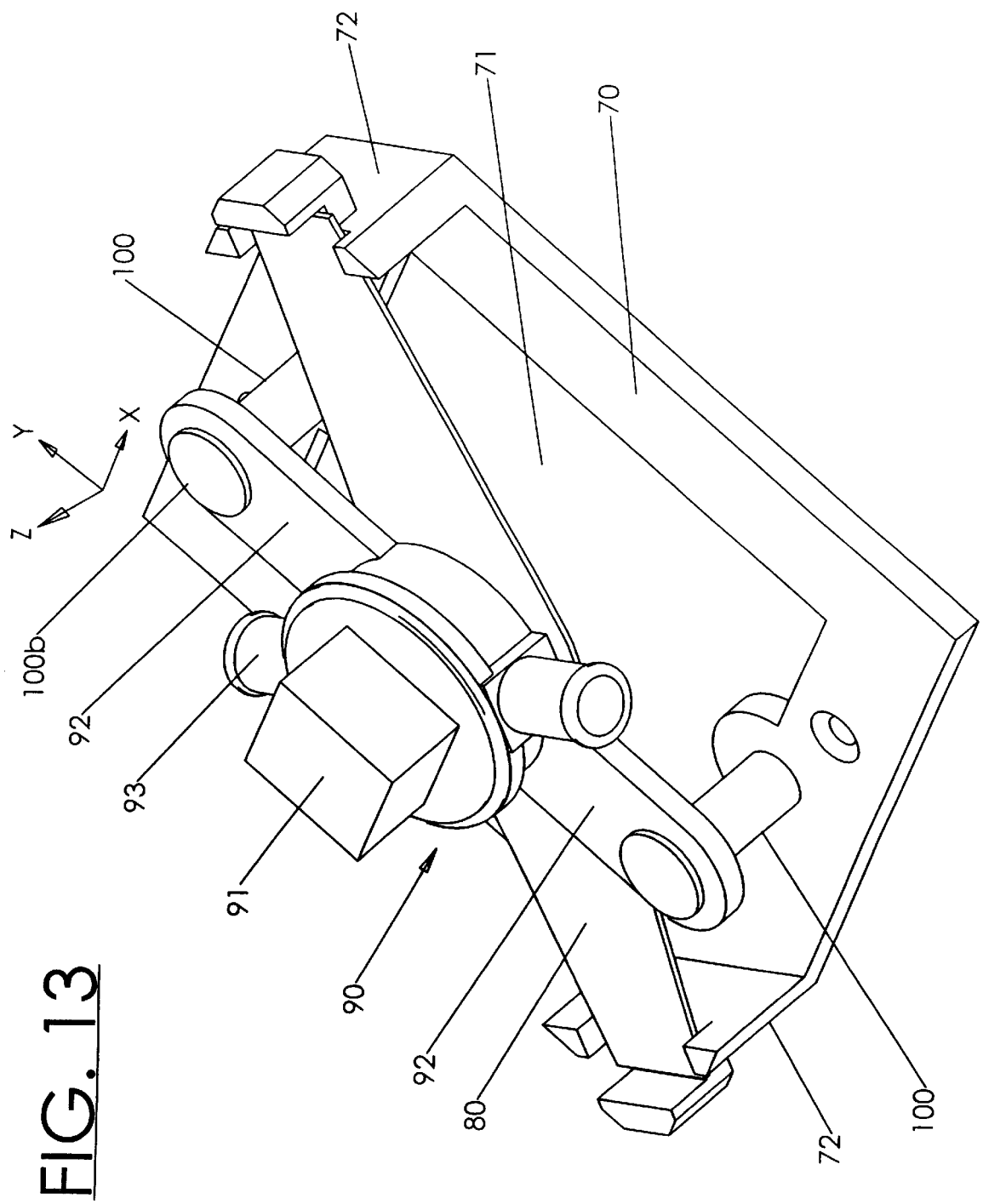
FIG. 13 shows another modification to the second embodiment of FIG. 10.

As another modification, the stops 100 in FIG. 10 can be replaced with a different structure which performs in a similar fashion. For example, each stop 100 in the FIG. 10 embodiment can be rotated 180° in the X-Z plane. With that modification, the holes 73 are deleted from the frame 70 and incorporated into the arms 92 of the heat exchanger; and the screws 100*a* are deleted from the arms 92 and added to the frame 70. Such a modification is shown in FIG. 13.

Figure 14:
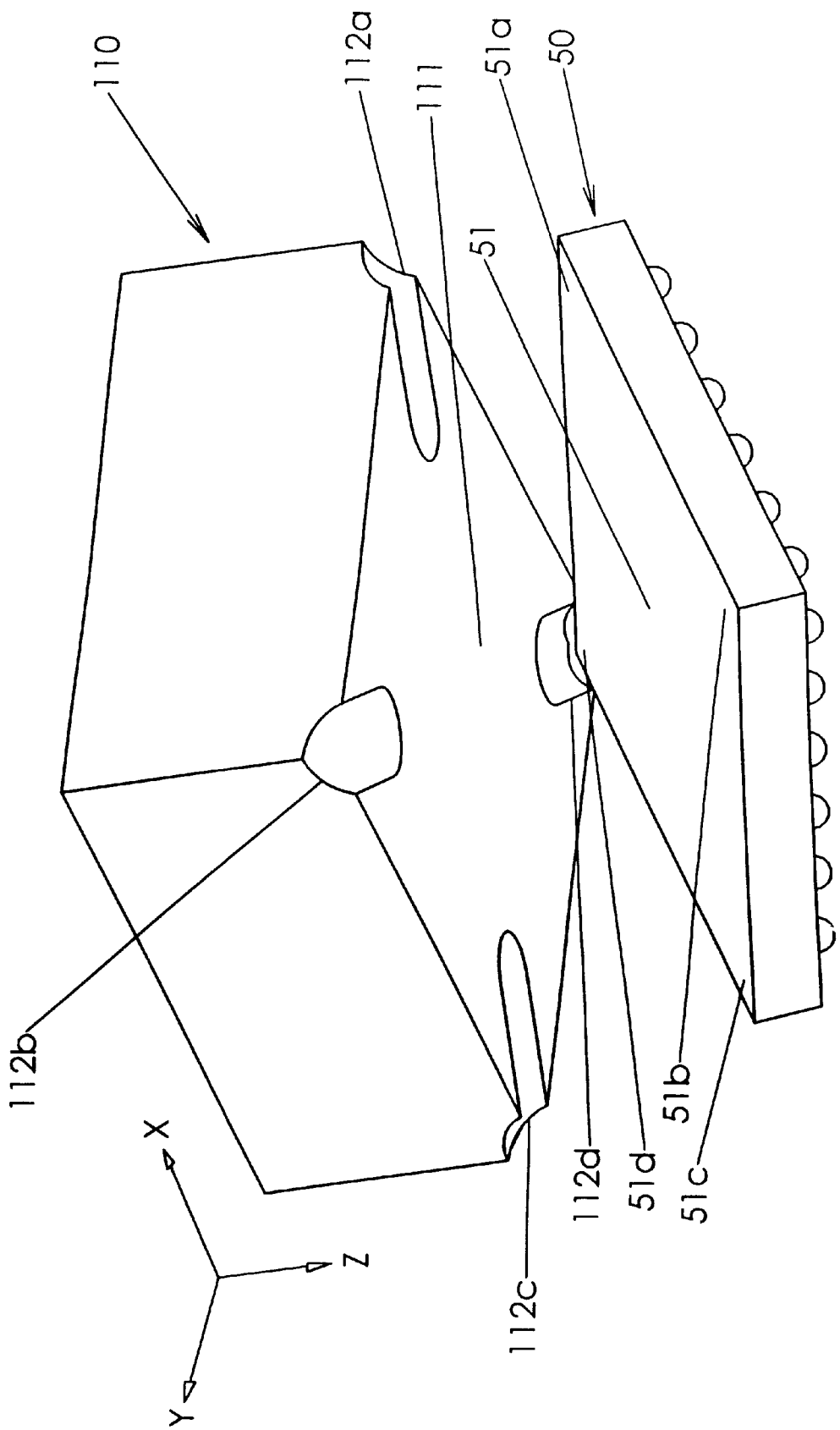
FIG. 14 shows a heat exchanger which constitutes a third embodiment of the present invention and which can be incorporated into the assembly of FIG. 1 and/or the assembly of FIG. 10.

Turning now to FIG. 14, the details of a third embodiment of the present invention will be described. The FIG. 14 embodiment is the same as the first embodiment of FIGS. 1–9, or the same as the second embodiment of FIGS. 10–13, with the exception that it includes a different heat exchanger 110. This heat exchanger 110 has a face 111 which is shaped to make contact with the entire planar surface 51 of the electronic device 50 except for each of the corners 51a–51d on that surface.

To ensure that the corners 51a–51d of the electronic device 50 are not contacted by face 111 of the heat exchanger 110, the heat exchanger has four grooves 112a–112d which extend from face 111 and which respectively align with the corners 51a–51d. Consequently, when face 111 lies flush against the planar surface 51, the corners 51a–51d are exposed by the grooves 112a–112d.

Figure 15:
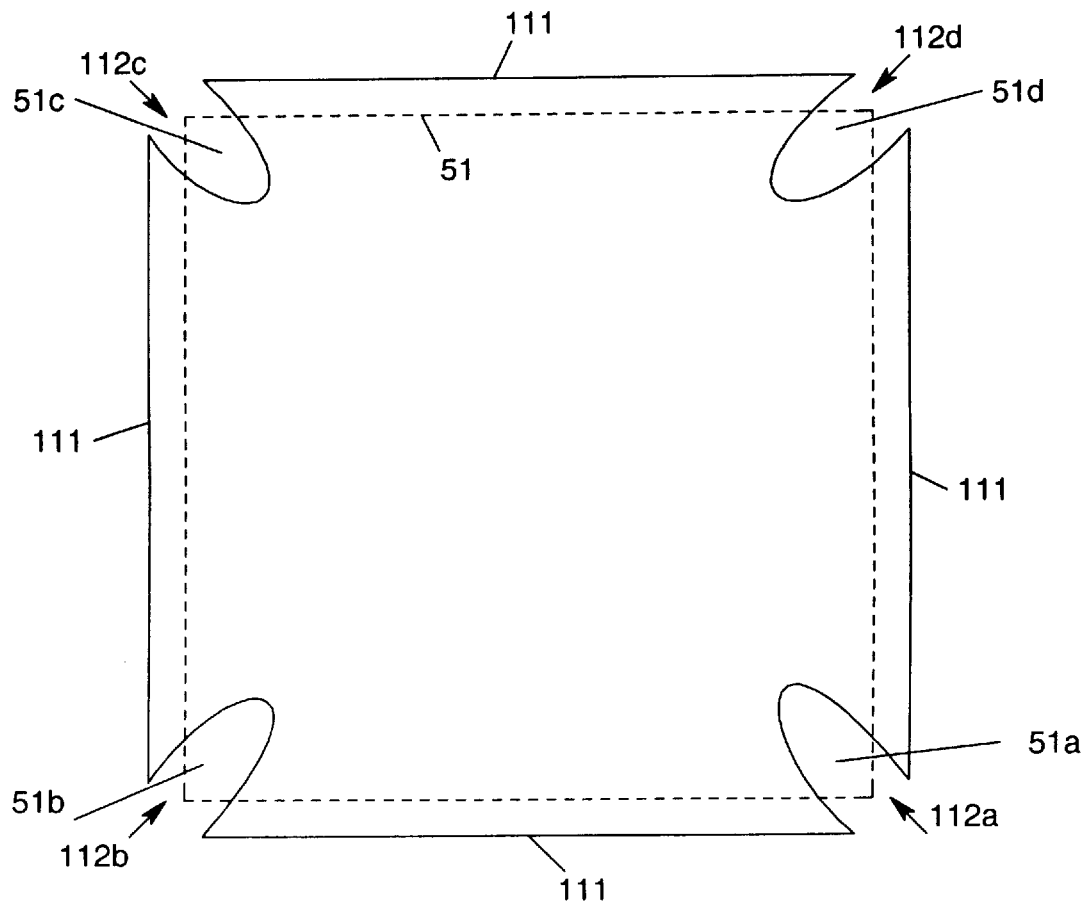
FIG. 15 shows a face on the heat exchanger in FIG. 14 as viewed perpendicular to the face.

The perimeter of the face of the heat exchanger 110, as viewed in the −Z direction, is shown by the solid lines 111 in FIG. 15. Also, superimposed on that face 111 in FIG. 15 are dashed lines 51 which show the perimeter of the planar surface on the electronic device 50 when that planar surface lies flush against face 111 of the heat exchanger. From these two superimposed perimeters it is clear that the corners 51a–51d on the electronic device are not contacted by face 110 on the heat exchanger because the corners are in the grooves 112a–112d.

One particular feature of the above-described FIG. 14 embodiment, is that when face 111 on the heat exchanger initially contacts the planar surface 51 on the electronic device, no force is exerted by the heat exchanger on the tip of any of the corners 51a–51d. Instead, the initial contact between face 111 on the heat exchanger and the planar surface 51 on the electronic device occurs on an edge which is spaced-apart from the tip of a corner.

Figure 15A:
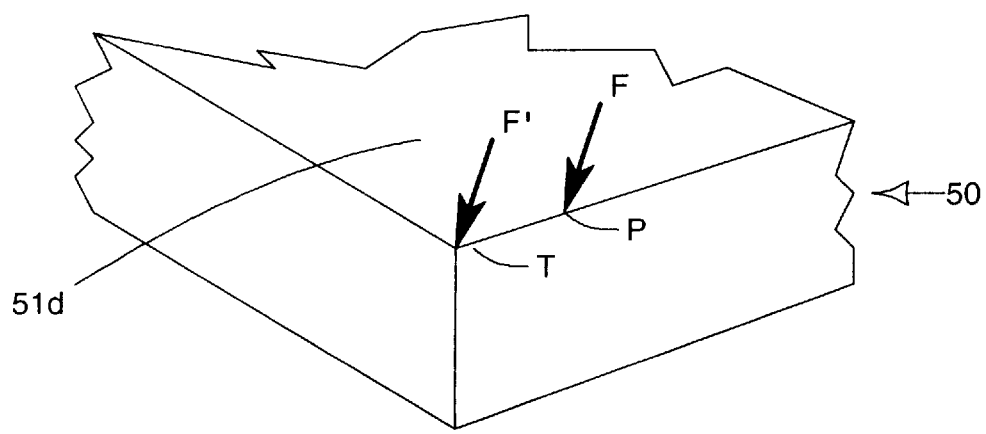
FIG. 15A shows how the heat exchanger of FIG. 14 avoids cracking the tip of the electronic device by not exerting any force on that tip.

The above feature is illustrated in FIG. 15a which is a blow-up of corner 51d in FIG. 14. In FIG. 15a, the initial contact between face 111 on the heat exchanger and surface 51 on the electronic device causes a force F to be exerted at a point P. Point P is spaced from the tip T of corner 51d because the tip is in the groove 112d. By comparison, if the groove 112d was eliminated, a force F' would be exerted on the tip T of the electronic device.

Preferably, the grooves 112a–112d have a rounded connection with face 111 of the heat exchanger. This insures that the initial contact at point P, between the heat exchanger and the electronic device, always involves at least one dull edge, which helps prevent the electronic device from cracking.

Also preferably, the grooves 112a–112d are made sufficiently wide such that face 111 of the heat exchanger contacts the planar surface 51 of the electronic device no closer than 8.0 mils or 0.2 millimeters from the tip of any corner. This also helps reduce the chances of cracking the electronic device 50. At the same time, the grooves 112a–112d preferably are kept sufficiently small such that at least 75% of the entire planar surface 51 of the electronic device is contacted by face 111 of the heat exchanger. This limitation ensures that grooves 112a–112d have no significant effect on the heat transfer between the electronic device and the heat exchanger.

As a modification to the FIG. 14 embodiment, the heat exchanger 110 can be enlarged in the X-Y directions, in which case the grooves 112a–112d need not extend to the sides of the heat exchanger. That is, the grooves 112a–112d can lie entirely within face 111 of the heat exchanger.

Figure 16:
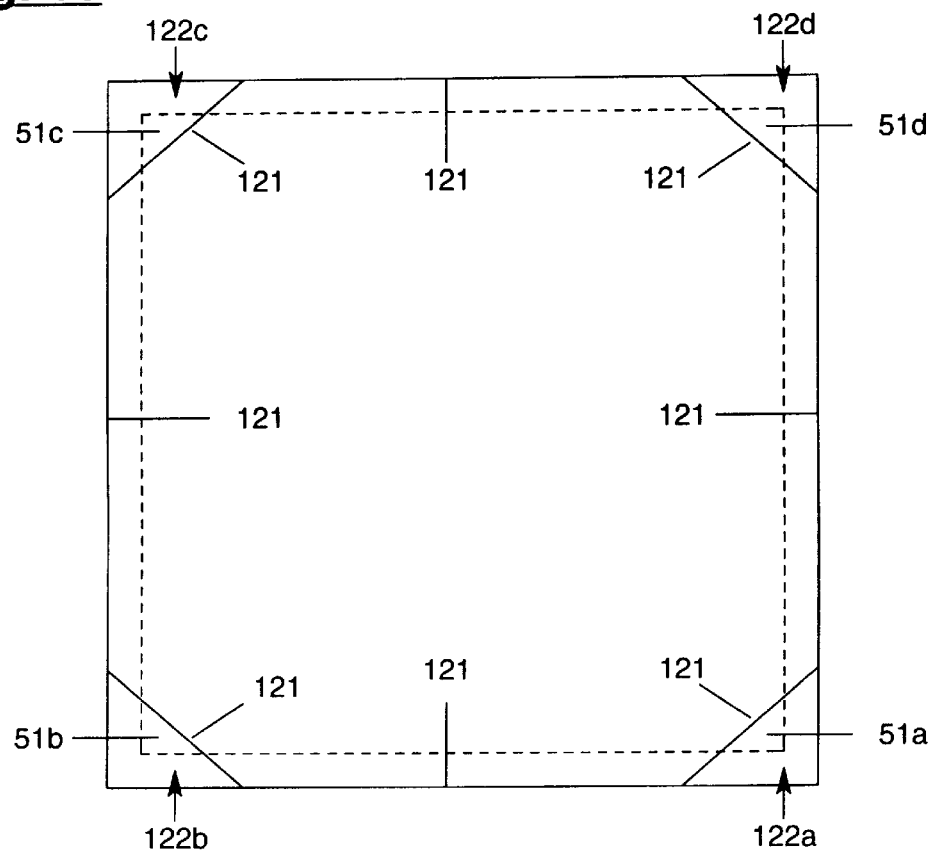
FIG. 16 shows a modification to the heat exchanger in FIG. 14.

As another modification to the FIG. 14 embodiment, the heat exchanger 110 can be changed such that it has a face 121 as shown in FIG. 16. From that face, four sides 122a–122d extend at beveled angles and expose the corners 51a–51d of the electronic device 50. These beveled sides 122a–122d replace the grooves 112a–112d in the FIG. 14 embodiment. Alternatively, the beveled sides can be rounded rather than flat; and/or they can extend from face 121 of the heat exchanger with a rounded edge.

Figure 17:
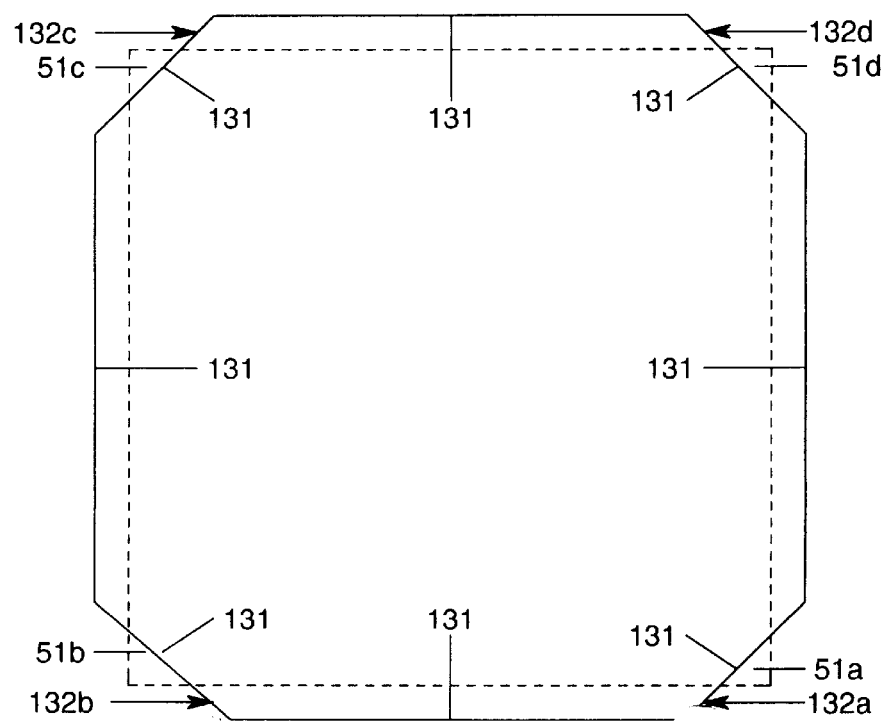
FIG. 17 shows another modification to the heat exchanger of FIG. 14.

As another modification, the heat exchanger 110 can be changed such that it has a face 131 as shown in FIG. 17. From that face, four sides 131a–132d extend at right angles and expose the corners 51a–51d of the electronic device 50 by crossing those corners at a diagonal. These four sides 132a–132d replace the grooves 112a–112d in the FIG. 14 embodiment.

Figure 18:
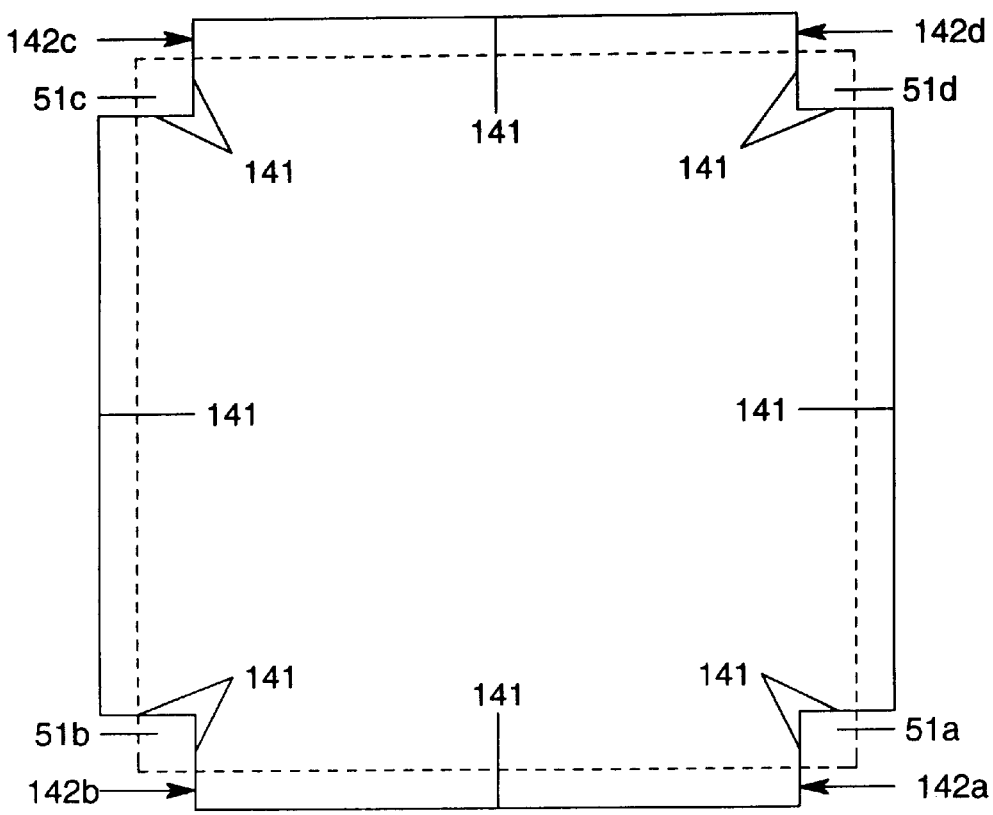
FIG. 18 shows another modification to the heat exchanger of FIG. 14.

As still another modification, the heat exchanger 110 in FIG. 14 can be changed such that it has a face 141 as shown in FIG. 18. From that face, several sides 142a–142d extend at right angles and expose the corners 51a–51d of the electronic device by crossing the corners in a non-straight path.

Three preferred embodiments of the present invention, as well as several modifications to each of those embodiments, has now been described in detail. In addition however, further changes can be made to the illustrated preferred embodiment and the illustrated modifications without departing from the nature and spirit of the invention.

For example, with each of the three embodiments, the heat exchanger that regulates the temperature of the electronic device is not limited to a heat exchanger which only cools the device. In particular, the heat exchanger can be one which maintains the electronic device at a constant temperature by heating or cooling the electronic device in response to control signals. Once such heat exchanger as shown in FIG. 1 of U.S. Pat. No. 5,821,505 which is assigned to the assignee of the present invention and is herein incorporated by reference. In that patent, the heat exchanger is comprised of a thin, flat electric heater 13 and a liquid cooled heat sink 14 which are laminated together. Such a heat exchanger can be held by multiple leaf springs in the assembly of FIGS. 1–9, or by a single leaf spring in the assembly of FIGS. 10–13; and, such a heat exchanger can have any of the faces of FIGS. 14–18.

Accordingly, it is to be understood that the invention is not limited to just the details of the illustrated preferred embodiment and modifications, but is defined by the appended claims.

What is claimed is:

1. A mechanical assembly for regulating the temperature of an electronic device; said assembly being comprised of:
    a frame which includes a plate with a hole;
    multiple leaf springs which are attached to said plate by a first attachment means and extend from said plate into said hole towards each other;
    a heat exchanger which lies in said hole, is attached to all of said leaf springs by a second attachment means, and has a face for mating with said electronic device; and,
    at least one of said first and second attachment means including slots which hold said leaf springs such that said leaf springs can move in said slots with a predetermined motion that is selected from the set of slipping and pivoting.

2. An assembly according to claim 1 wherein said plate has top and bottom surfaces and said leaf springs lie, in a quiescent state, entirely between said top and bottom surfaces of said plate.

3. An assembly according to claim 1 wherein said leaf springs have a flat shape, in a quiescent state, which place said face of said heat exchanger in one plane parallel to said plate and stop said face from moving sideways in said plane.

4. An assembly according to claim 1 wherein said leaf springs have a flat shape, in a quiescent state, which place said face of said heat exchanger in one plane parallel to said plate and stop said face from twisting in said plane.

5. An assembly according to claim 1 wherein said leaf springs have a flat shape, in a quiescent state, which place said face of said heat exchanger in one plane parallel to said plate and prevent said face from tilting out of said plane with a moment that is proportional to the amount of tilt.

6. An assembly according to claim 1 wherein said slots are in said heat exchanger and have an opening in which said leaf springs slip when they are deflected.

7. An assembly according to claim 1 wherein said slots are in said frame and have an opening in which said leaf springs slip when they are deflected.

8. An assembly according to claim 1 wherein said slots are in said heat exchanger and have an opening in which said leaf springs pivot when they are deflected.

9. An assembly according to claim 8 wherein each leaf spring gets narrower in width as the distance along the leaf spring to its pivot point in said slots decreases.

10. An assembly according to claim 1 wherein said slots are in said frame and have an opening in which said leaf springs pivot when they are deflected.

11. An assembly according to claim 10 wherein each leaf spring gets narrower in width as the distance along the leaf spring to its pivot point in said slots decreases.

12. An assembly according to claim 1 wherein the total number of said leaf springs is just two.

13. An assembly according to claim 1 wherein the total number of said leaf springs is less than ten.

14. An assembly according to claim 1 wherein said heat exchanger includes a passageway with an input and an output for a liquid.

* * * * *